(12) United States Patent
Druml et al.

(10) Patent No.: US 11,150,331 B2
(45) Date of Patent: Oct. 19, 2021

(54) DETECTION AND COMPENSATION OF MEMS OSCILLATING STRUCTURE ASYMMETRIES AND PERIODIC JITTERS

(71) Applicant: Infineon Technologies AG, Neubiberg (DE)

(72) Inventors: Norbert Druml, Graz (AT); Philipp Greiner, Graz (AT); Ievgeniia Maksymova, Graz (AT)

(73) Assignee: Infineon Technologies AG

( * ) Notice: Subject to any disclaimer, the term of this patent is extended or adjusted under 35 U.S.C. 154(b) by 621 days.

(21) Appl. No.: 16/039,876

(22) Filed: Jul. 19, 2018

(65) Prior Publication Data

US 2020/0011976 A1 Jan. 9, 2020

Related U.S. Application Data

(60) Provisional application No. 62/694,562, filed on Jul. 6, 2018.

(51) Int. Cl.
| | |
|---|---|
| *G01S 7/48* | (2006.01) |
| *G01S 7/497* | (2006.01) |
| *G01S 7/481* | (2006.01) |
| *H03B 17/00* | (2006.01) |

(52) U.S. Cl.
CPC ............ *G01S 7/497* (2013.01); *G01S 7/4817* (2013.01); *H03B 17/00* (2013.01)

(58) Field of Classification Search
None
See application file for complete search history.

(56) References Cited

U.S. PATENT DOCUMENTS

| | | | | |
|---|---|---|---|---|
| 2003/0090783 | A1* | 5/2003 | So .................... | G02B 27/4233 359/337.11 |
| 2011/0169578 | A1* | 7/2011 | Lucas ................ | H03L 7/1976 331/25 |
| 2014/0049783 | A1* | 2/2014 | Royo Royo .......... | G01S 7/486 356/601 |
| 2018/0259645 | A1* | 9/2018 | Shu ..................... | G01S 17/42 |
| 2018/0348506 | A1* | 12/2018 | Duvdevany .......... | H03L 7/0814 |

FOREIGN PATENT DOCUMENTS

WO 2006005037 A2 1/2006

\* cited by examiner

*Primary Examiner* — Hovhannes Baghdasaryan
(74) *Attorney, Agent, or Firm* — Design IP

(57) ABSTRACT

Systems and methods are provided for compensating errors. A system includes a microelectromechanical systems (MEMS) oscillating structure configured to oscillate about a rotation axis; a phase error detector configured to generate a phase error signal based on measured event times and expected event times of the MEMS oscillating structure oscillating about the rotation axis; and a compensation circuit configured to receive the phase error signal, remove periodic jitter components in the phase error signal to generate a compensated phase error signal, and output the compensated phase error signal.

21 Claims, 7 Drawing Sheets

DETECTION AND COMPENSATION OF MEMS OSCILLATING STRUCTURE ASYMMETRIES AND PERIODIC JITTERS

CROSS-REFERENCE TO RELATED APPLICATIONS

This application claims the benefit of U.S. 62/694,562 filed on Jul. 6, 2018, which is incorporated by reference as if fully set forth.

FIELD

The present disclosure relates generally to a microelectromechanical systems (MEMS) oscillating system and method for operating the same, and, more particularly, to detecting and compensating periodic jitter components in a MEMS signal.

BACKGROUND

Light Detection and Ranging (LIDAR), is a remote sensing method that uses light in the form of a pulsed laser to measure ranges (variable distances) to one or more objects in a field of view. In particular, a microelectromechanical systems (MEMS) mirror is used to scan light across the field of view. Arrays of photodetectors receive reflections from objects illuminated by the light, and the time it takes for the reflections to arrive at various sensors in the photodetector array is determined. This is also referred to as measuring time-of-flight (TOF). LIDAR systems form depth measurements and make distance measurements by mapping the distance to objects based on the time-of-flight computations. Thus, the time-of-flight computations can create distance and depth maps, which may be used to generate images.

MEMS mirrors operated at a certain resonance frequency are impacted by various systematic and non-systematic error sources. Two prominent error sources leading to periodic jitter of a position detection of the MEMS mirror are: asymmetry of the manufactured MEMS mirror and chopping errors introduced by a chopper that is used to compensate an offset error in operational amplifiers (op amps) in the system circuitry used to detect the position of the MEMS mirror.

The asymmetry of the MEMS mirror is a result of asymmetries in the mirror structure that are introduced at the time of manufacturing. These asymmetries result in different timings of zero crossing events when moving from the left or right side. This may result in a considerable laser shooting/pointing error.

In addition, as a MEMS mirror operates in a periodic fashion, chopping can be used for compensation of offset errors in op amps. The voltage/current offset compensations via chopping can lead to a periodic voltage that results in periodic jitter. Therefore, a periodic jitter can be caused by the asymmetry of the mirror, as well as by the chopping.

These issues may lead to a mismatch between expected mirror position and measured position. Since the precise measurement and estimation of the mirror's position is important for a MEMS-based LIDAR system, it is important to be able to detect and compensate systematic and non-systematic error sources within the mirror's driving Application-Specific Integrated Circuit (ASIC).

Therefore, an improved device capable of detecting and compensating these periodic jitter errors may be desirable.

SUMMARY

Embodiments provide a microelectromechanical systems (MEMS) mirror scanning system and method for operating the same, and, more particularly, to detecting and compensating periodic jitter components in a MEMS signal.

A system includes a MEMS oscillating structure configured to oscillate about a rotation axis; a phase error detector configured to generate a phase error signal based on measured event times and expected event times of the MEMS oscillating structure oscillating about the rotation axis; and a compensation circuit configured to receive the phase error signal, remove periodic jitter components in the phase error signal to generate a compensated phase error signal, and output the compensated phase error signal.

A method of compensating errors includes driving a MEMS oscillating structure configured to oscillate about a rotation axis; generating a phase error signal based on measured event times and expected event times of the MEMS oscillating structure oscillating about the rotation axis, wherein the phase error signal includes periodic jitter components; generating a compensated phase error signal by removing the periodic jitter components from the phase error signal; and outputting the compensated phase error signal.

A Light Detection and Ranging (LIDAR) system includes a LIDAR light source configured to generate LIDAR light beams; a MEMS oscillating structure configured to oscillate about a rotation axis and transmit the LIDAR light beams into a field of view; a photodetector array configured to detect reflected LIDAR light beams from the field of view and generate electrical signals based on the reflected LIDAR light beams; an error detector configured to monitor for and detect an error related to an oscillation of the MEMS oscillating structure, and generate an error signal based on the detected error; and a compensation circuit configured to receive the error signal and actively compensate for the error based on the error signal.

BRIEF DESCRIPTION OF THE DRAWINGS

Embodiments are described herein making reference to the appended drawings.

DETAILED DESCRIPTION

Figure 1:
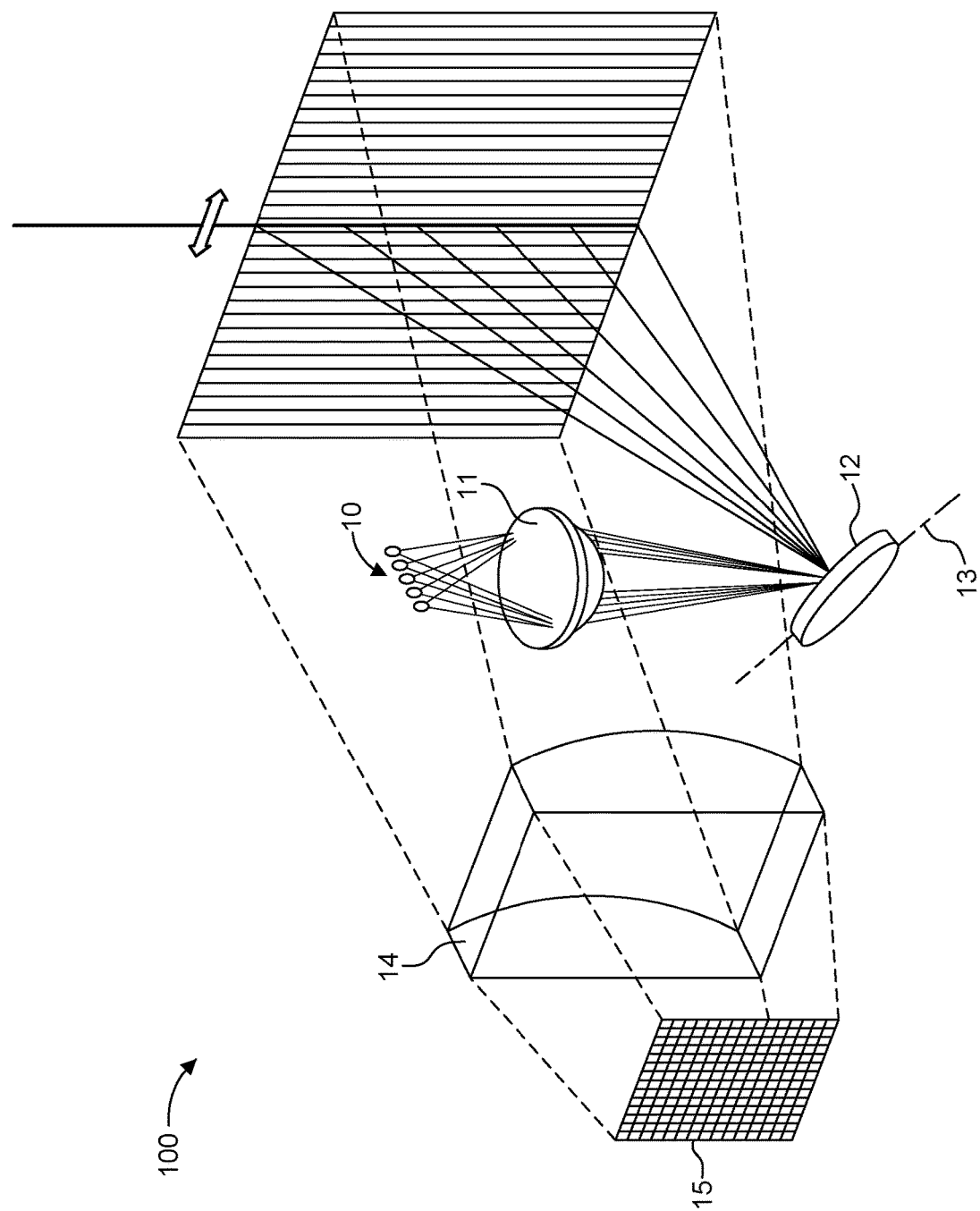
FIG. 1 is a schematic diagram of a LIDAR scanning system 100 in accordance with one or more embodiments.

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photos of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

In LIDAR systems, a source transmits light pulses and/or beams into a field of view and the light reflects from one or more objects by backscattering. In particular, LIDAR is a direct Time-of-Flight (TOF) system in which the light pulses (e.g., laser pulses of infrared light) are emitted into the field of view, and a pixel array detects and measures the reflected pulses. For example, an array of photodetectors receive reflections from objects illuminated by the light.

Differences in return times for each light pulse across multiple pixels of the pixel array can then be used to make digital 3D representations of an environment or to generate other sensor data. For example, the light source may emit a single light pulse, and a time-to-digital converter (TDC) electrically coupled to the pixel array may count from the time the light pulse is emitted until a time the reflected light pulse is received at the receiver (i.e., at the pixel array). The "time-of-flight" of the light pulse is then translated into a distance.

A scan such as a oscillating horizontal scan (e.g., from left to right and right to left of a field of view) can illuminate a scene in a continuous scan fashion. By emitting successive light pulses in different scanning directions, an area referred to as the "field of view" can be scanned and objects within the area can be detected and imaged. A raster scan could also be used.

FIG. 1 is a schematic diagram of a LIDAR scanning system 100 in accordance with one or more embodiments. The LIDAR scanning system 100 is an optical scanning device that includes a transmitter, including an illumination unit 10, a transmitter optics 11, and a one-dimensional (1D) microelectromechanical systems (MEMS) mirror 12, and a receiver, including a second optical component 14 and a photodetector detector array 15.

The illumination unit 10 includes multiple light sources (e.g., laser diodes or light emitting diodes) that are linearly aligned in single bar formation and are configured to transmit light used for scanning an object. The light emitted by the light sources is typically infrared light although light with other wavelength might also be used. As can be seen in the embodiment of FIG. 1, the shape of the light emitted by the light sources is spread in a direction perpendicular to the transmission direction to form a light beam with an oblong shape perpendicular to a transmission. The illumination light transmitted from the light sources are directed towards the transmitter optics 11 configured to focus each laser onto a one-dimensional MEMS mirror 12. The transmitter optics 11 may be, for example, a lens or a prism. When reflected by the MEMS mirror 12, the light from the light sources are aligned vertically to form a one-dimensional vertical scanning line of infrared light or a vertical bar of infrared light. Each light source of the illumination unit 10 contributes to a different vertical region of the vertical scanning line. While five laser sources are shown, it will be appreciated that the number of laser sources are not limited thereto. For example the vertical scanning line may be generated by a single laser source, two laser sources, and so on. It will also be appreciated that the light sources may be arranged in a matrix formation.

The MEMS mirror 12 is a mechanical moving mirror (i.e., a MEMS micro-mirror) integrated on a semiconductor chip (not shown). The MEMS mirror 12 according to this embodiment is configured to rotate about a single axis and can be said to have only one degree of freedom for movement. Due to this single axis of rotation, the MEMS mirror 12 is referred to as a 1D MEMS mirror.

The MEMS mirror 12 is configured to oscillate "side-to-side" about a single scanning axis 13 such that the light reflected from the MEMS mirror 12 (i.e., the vertical scanning line of light) oscillates back and forth in a horizontal scanning direction. The MEMS mirror 12 rotating in a first rotation direction (e.g., from a left side to a right side) may represent a clockwise rotation about the scanning axis 13, and rotating in a second rotation direction (e.g., from the right side to the left side) may represent a counter-clockwise rotation about the scanning axis 13.

A scan comprises a scanning period or an oscillation period defined, for example, by one complete oscillation from a first edge of the field of view (e.g., left side) to a second edge of the field of view (e.g., right side) and then back again to the first edge. A mirror period of the MEMS mirror 12 corresponds to a scanning period.

Thus, the field of view is scanned in the horizontal direction by the vertical bar of light by changing the angle of the MEMS mirror 12 on its scanning axis 13. For example, the MEMS mirror 12 may be configured to oscillate between +/−15 degrees to steer the light over 30 degrees making up the scanning range of the field of view. Thus, the field of view may be scanned, line-by-line, by a rotation of the MEMS mirror 12 through its degree of motion. One such sequence through the degree of motion (e.g., from −15 degrees to +15 degrees) is referred to as a single scan or scanning cycle. Multiple scans may be used to generate distance and depth maps, as well as 3D images by a processing unit. The horizontal resolution of the depth maps and images depends on the size of the incremental steps in rotation angle of the MEMS mirror 12 taken between scans.

While the transmission mirror is described in the context of a MEMS mirror, it will be appreciated that other 1D mirrors can also be used. In addition, the degree of rotation is not limited to +/−15 degrees, and the field of view may be increased or decreased according to the application.

Upon impinging one or more objects, the transmitted bar of vertical light is reflected back towards the LIDAR scanning system 100 where the second optical component 14 (e.g., a lens or prism) receives the reflected light. The second optical component 14 directs the reflected light onto the photodetector detector array 15 that is configured to generate electrical measurement signals, which may be used for generating a 3D map of the environment and/or other object data based on the reflected light (e.g., via TOF calculations and processing).

The photodetector array 15 can be any of a number of photodetector types; including avalanche photodiodes (APD), photocells, and/or other photodiode devices. Imaging sensors such as charge-coupled devices (CCDs) can be the photodetectors. In the examples provided herein, the photodetector array 15 is a two-dimensional (2D) APD array that comprises an array of APD pixels. In other embodiments, the photodetector array 15 may be a 1D array that includes a single column of photodiodes. The activation of the photodiodes may be synchronized with light pulses emitted by the illumination unit 10.

The photodetector array 15 receives reflective light pulses and generates electrical signals in response thereto. Since the time of transmission of each light pulse from the illumination unit 10 is known, and because the light travels at a known speed, a time-of-flight computation using the electrical signals can determine the distance of objects from the photodetector array 15. A depth map can plot the distance information.

In one example, for each distance sampling, a microcontroller triggers a laser pulse from each of the light sources of the illumination unit 10 and also starts a timer in a Time-to-Digital Converter (TDC) Integrated Circuit (IC). The laser pulse is propagated through the transmission optics, reflected by the target field, and captured by an APD of the APD array 15. The APD emits a short electrical pulse which is then amplified by an electrical signal amplifier. A comparator IC recognizes the pulse and sends a digital signal to the TDC to stop the timer. The TDC uses a clock frequency to calibrate each measurement. The TDC sends the serial data of the differential time between the start and stop digital signals to the microcontroller, which filters out any error reads, averages multiple time measurements, and calculates the distance to the target at that particular field position. By emitting successive light pulses in different directions established by the MEMS mirror, an area can be scanned, a three-dimensional image can be generated, and objects within the area can be detected.

Figure 2:
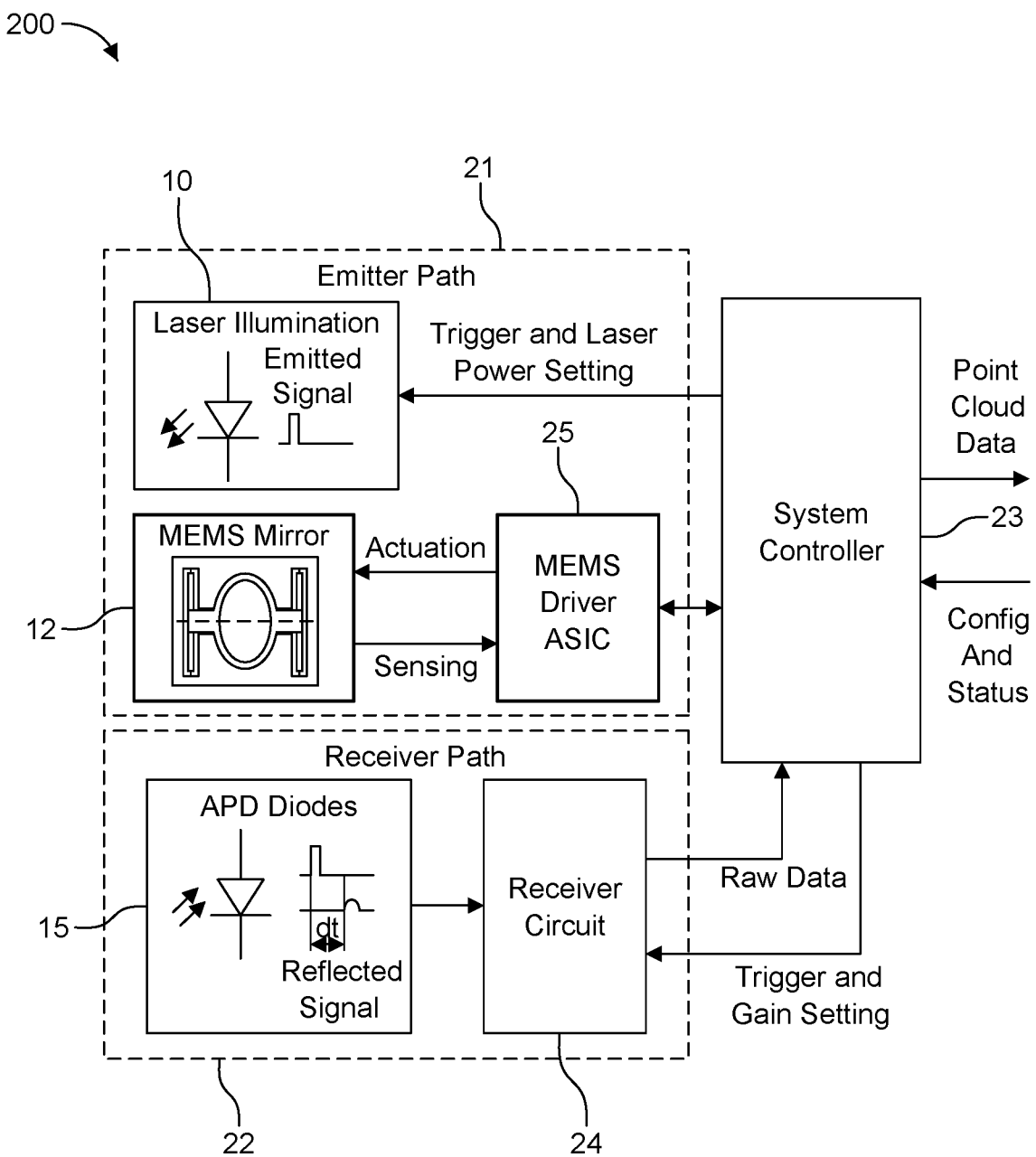
FIG. 2 is a schematic block diagram of the LIDAR scanning system 200 in accordance with one or more embodiments.

FIG. 2 is a schematic block diagram of the LIDAR scanning system 200 in accordance with one or more embodiments. In particular, FIG. 2 shows additional features of the LIDAR scanning system 200, including example processing and control system components such as a MEMS driver ASIC, a receiver circuit, and a system controller.

The LIDAR scanning system 200 includes a transmitter unit 21 that is responsible for an emitter path of the system 200, and a receiver unit 22 that is responsible for a receiver path of the system 200. The system also includes a system controller 23 that is configured to control components of the transmitter unit 21 and the receiver unit 22, and to receive raw data from the receiver unit 22 and perform processing thereon (e.g., via digital signal processing) for generating object data (e.g., point cloud data). Thus, the system controller 23 includes at least one processor and/or processor circuitry for processing data, as well as control circuitry, such as a microcontroller, that is configured to generate control signals.

The receiver unit 22 includes the photodetector array 15 as well as a receiver circuit 24. The receiver circuit 24 may include one or more circuitries or sub-circuitries for receiving and/or processing information. The receiver circuit 24 may receive the analog electrical signals from the APD diodes of the photodetector array 15 and transmit the electrical signals as raw analog data or raw digital data to the system controller 23. In order to transmit the raw data as digital data, the receiver circuit 24 may include an analog-to-digital converter (ADC) and a field programmable gate array (FPGA). The receiver circuit 24 may also receive trigger control signals from the system controller 23 that triggers an activation of one or more APD diodes. The receiver circuit 24 may also receive gain setting control signals for controlling the gain of one or more APD diodes.

The transmitter unit 21 includes the illumination unit 10, the MEMS mirror 12, and a MEMS driver ASIC 25 configured to drive the MEMS mirror 12. In particular, the MEMS driver ASIC 25 actuates and senses the rotation position of the mirror, and provides position information (e.g., degree of rotation about the rotation axis) of the mirror to the system controller 23. Based on this position information, the laser source of the illumination unit 10 is triggered by the system controller and the photodiodes (e.g., APD diodes) are activated to sense, and thus measure, a reflected light signal. Thus, a higher accuracy in position sensing of the MEMS mirror results in a more accurate and precise control of other components of the LIDAR system.

By sensing the rotation position of the MEMS mirror 12 about its rotation axis 13, the MEMS driver ASIC 25 can sense zero-crossing events of the MEMS mirror 12. A zero-crossing event is an instance when the MEMS mirror 12 has a rotation angle of 0° on its rotation axis 13. Specifically, it is the moment when the MEMS mirror 12 is flat. Since the MEMS mirror 12 oscillates back and forth between two rotation directions, a zero-crossing event occurs twice during a scanning period—once as the mirror oscillates in the first rotation direction, and once as the mirror oscillates in the second rotation direction.

In some embodiments, an event time may correspond to a non-zero crossing event. For example, the sensed rotation angle may be some angle other than 0°. However, for the purpose of explanation, examples herein will be described in the context of sensing zero-crossing events.

The MEMS driver ASIC 25 is configured to detect each zero-crossing event and record a timing for each event. This timing information (i.e., measured zero-crossing time) can then be compared by the MEMS driver ASIC 25 with an expected zero-crossing time for each zero-crossing to detect asymmetries in the movement of the MEMS mirror 12 with respect to the two rotation directions. For example, the clockwise pass of the mirror may be faster or slower than the counter-clockwise pass of the mirror due to the asymmetry of the mirror. The MEMS driver ASIC 25 may also send the position information to the system controller 23 so that the system controller 23 can use the position information to control the triggering of the laser pulses of the illumination unit 10 and the activation of the photodiodes of the photodetector array 15.

The MEMS mirror 12 includes an actuator structure used to drive the mirror. The actuator structure includes interdigitated finger electrodes made of interdigitated mirror combs and frame combs to which a driving voltage (e.g., 100V) is applied by the MEMS driver ASIC 25. The driving voltage applied to the finger structure generates a corresponding capacitance. The driving voltage across the finger structure creates a driving force between interdigitated mirror combs and the frame combs, which creates a torque on the mirror body about the rotation axis. The driving voltage can be switched or toggled on and off resulting in an oscillating driving force. The oscillating driving force causes the mirror to oscillate back and forth on its rotation axis between two extrema. As the mirror oscillates, the capacitance between the finger electrodes changes according to the mirror's rotation position. The MEMS driver ASIC 25 is configured to measure the capacitance between the interdigitated finger electrodes, and determine a rotation position or angle position of the MEMS mirror 12 therefrom. By monitoring the capacitance, the MEMS driver ASIC 25 can detect the zero-crossing events and a timing thereof.

As will be described in further detail, the sensing of the position of the MEMS mirror 12 is performed based on a mirror phase error detector that is configured to measure the capacitance. For example, as the MEMS mirror moves, the geometry of the finger structure changes, resulting in a change in the geometry of the capacitance. As the geometry of the capacitance changes, the capacitance itself changes. Thus, a specific capacitance corresponds directly with a specific position (i.e., rotation angle) of the MEMS mirror. By sensing the capacitance of the finger structure, a specific position of the MEMS mirror can be determined.

One way to measure the capacitance is to measure a current flowing through the finger structure, convert the measured current into a voltage, and then further correlate the voltage to a capacitance and/or rotation angle. However, any method to measure the capacitance may be used. A rotation direction (e.g., positive or negative, left-to-right or right-to-left, clockwise or counter-clockwise, etc.) is also detected by measuring a change in capacitance over time, where a positive or a negative change indicates opposing rotation directions.

As noted above, increasing the accuracy of position sensing of the mirror may improve the overall accuracy of the LIDAR system. For example, accuracy requirements may require a laser to be shot within +/−2 millidegrees (i.e., a range of 4 millidegrees) of a vertical target line while the mirror is oscillating at a frequency of, for example, 2 kHz. This translates into an acceptable timing error or error budget of approximately 20 nanoseconds at which the laser must be fired at the mirror to comply with being within +/−2 millidegrees from the target line. Therefore, precisely sensing the position of the mirror is important in order to fulfil this requirement.

Since the mirror is driven at a set oscillation frequency, when the mirror rotates in a first rotation direction (e.g., left-to-right or clockwise), it crosses a zero position (i.e., 0°) at a certain point of time. The same can be said when the mirror rotates in a second rotation direction (e.g., right-to-left or counter-clockwise), the mirror will cross the zero position at a certain point in time. These instances of crossing the zero position may be referred to as zero-crossing events which occur at zero-crossing times.

However, due to variabilities introduced during manufacturing and by aging of the mirror, asymmetries in the mirror may exist and may change over time. These asymmetries cause differences in timing between movement in the first rotation direction compared to movement in the second rotation direction. Said differently, the time interval between two zero-crossings where the later of the two zero crossings is in the first rotation direction may differ from the time interval where the later of the two zero crossings is in the second rotation direction. In addition, one or both zero crossings may deviate from an expected zero-crossing calculated based on the oscillation frequency.

Figure 3:
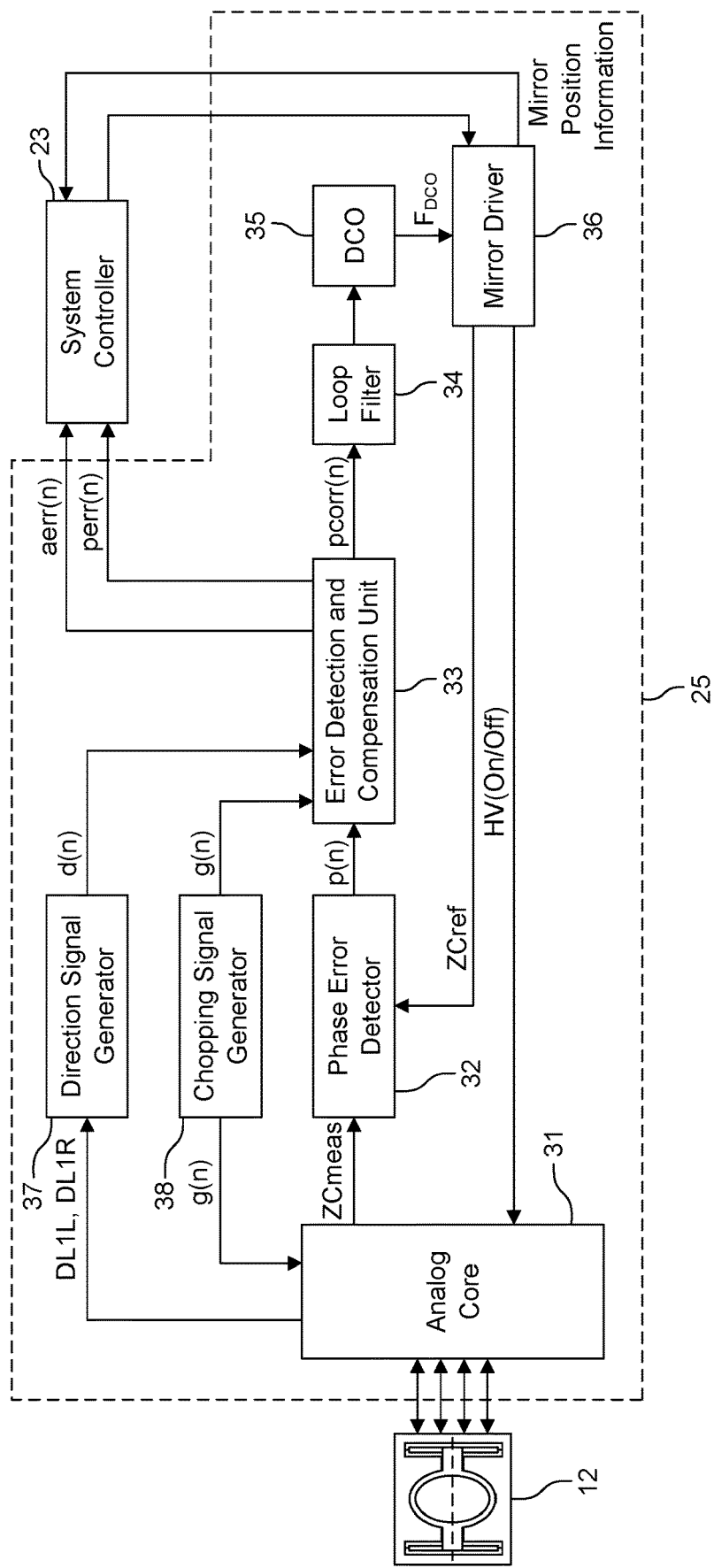
FIG. 3 shows a schematic block diagram of a MEMS driver ASIC according to one or more embodiments.

FIG. 3 shows a schematic block diagram of a MEMS driver ASIC according to one or more embodiments. The MEMS driver ASIC 25 includes an analog core 31, a phase error detector 32, an error detection and compensation unit 33, a loop filter 34, a digitally controlled oscillator (DCO) 35, and a mirror driver 36 arranged in a loop. This loop, together with the MEMS mirror 12, forms a phase-locked loop (PLL) that follows the frequency of the MEMS mirror 12. The MEMS driver ASIC 25 further includes a direction signal generator 37 and a chopping signal generator 38. However, it will be appreciated that the direction signal generator 37 and the chopping signal generator 38 may also be provided outside of the MEMS driver ASIC 25. The MEMS driver ASIC 25 is in electrical communication with the MEMS mirror 12 and the system controller 23 via electrical connections that are used to transmit signals therebetween.

Thus, the MEMS driver ASIC 25 implements analog circuitry and digital circuitry. The analog circuitry (i.e., the analog core 31) includes one or more inputs and outputs connected to the MEMS mirror 12. For example, one or more inputs of the analog core 31 may receive analog signals from the MEMS mirror 12 related to the position and rotation direction of the mirror. In addition, one or more outputs of the analog core 31 may provide control signals to the MEMS mirror 12 for controlling the oscillation of the mirror.

The analog core 31 includes analog circuitry configured to measure the capacitance of the finger structure of the MEMS mirror actuator in order to measure timing-critical events, such as zero-crossings with the aid of comparators. Thus, the analog circuitry measures a position of the MEMS mirror 12 about a rotation axis and determines zero-crossing times in a first rotation direction and in a second rotation direction. The analog circuitry is also configured to generate direction information DL1L and DL1R related to the direction of rotation (e.g., clockwise or counter-clockwise) of the MEMS mirror 12. The remaining, digital circuitry implements the chip's intelligence (control of mirror, laser pulse triggering, photodiode activation triggering, etc.). This approach enables digital signal processing solutions in order to detect systematic and non-systematic error sources which can then be compensated.

The analog core 31 is configured to generate and output measured zero-crossing times ZCmeas of the MEMS mirror 12, which is received by the phase error detector 32. The analog core 31 is further configured to provide direction information DL1L and DL1R related to the direction of rotation (e.g., clockwise or counter-clockwise) of the MEMS mirror 12 to the direction signal generator 37, which is configured to generate a direction signal d(n) (e.g., +1 or −1) based on the direction information DL1L and DL1R.

The phase error detector 32 is configured to receive the measured zero-crossing times ZCmeas from the analog core 31 and reference zero-crossing times ZCref from the mirror driver 36. The reference zero-crossing times ZCref are expected zero-crossing times of the MEMS mirror 12 based on the oscillation frequency of the mirror. The reference zero-crossing times ZCref are generated by the mirror driver 36 (i.e., by the PLL).

The phase error detector 32 includes comparator circuitry that is configured to compare the measured (actual) zero-crossing times ZCmeas and the reference zero-crossing times ZCref, and output a difference thereof. Thus, the phase error detector is configured to compare the measured zero-crossing timing with an expected zero-crossing timing, and generate an error signal p(n) representative of the difference between the measured zero-crossing timing and the expected zero-crossing timing. In other words, the phase error signal p(n) represents the phase error between the measured zero-crossing times ZCmeas and the reference zero-crossing times ZCref. The phase error signal p(n) is actively output for each zero-crossing of the MEMS mirror 12.

For example, the phase error signal p(n) will be zero if measured zero-crossing time and expected zero-crossing time are equal. Otherwise, the phase error signal will be a non-zero value corresponding to the difference between the measured zero-crossing time and expected zero-crossing time.

In addition, the phase error signal p(n) is generated for both rotation directions of the mirror. For example, in the case that asymmetry exists, the phase error detector 32 may generate a phase error signal p(n) having a value of +3 corresponding to a first rotation direction, and may generate a phase error signal p(n) having a value of −3 corresponding to a second rotation direction. As long as the values are not equal for the two rotation directions, asymmetry exists.

Each pass of the MEMS mirror (i.e., from left-to-right or right-to-left) generates a value for the phase error signal p(n). In particular, any time the MEMS mirror 12 rotates past the zero-crossing, a timing of the zero-crossing is measured, and a phase error signal p(n) is generated based thereon in comparison to the expected zero-crossing time. Thus, the PLL error spectrum represents the output of the phase detector over time (i.e., the phase error signal over time).

Figure 4:
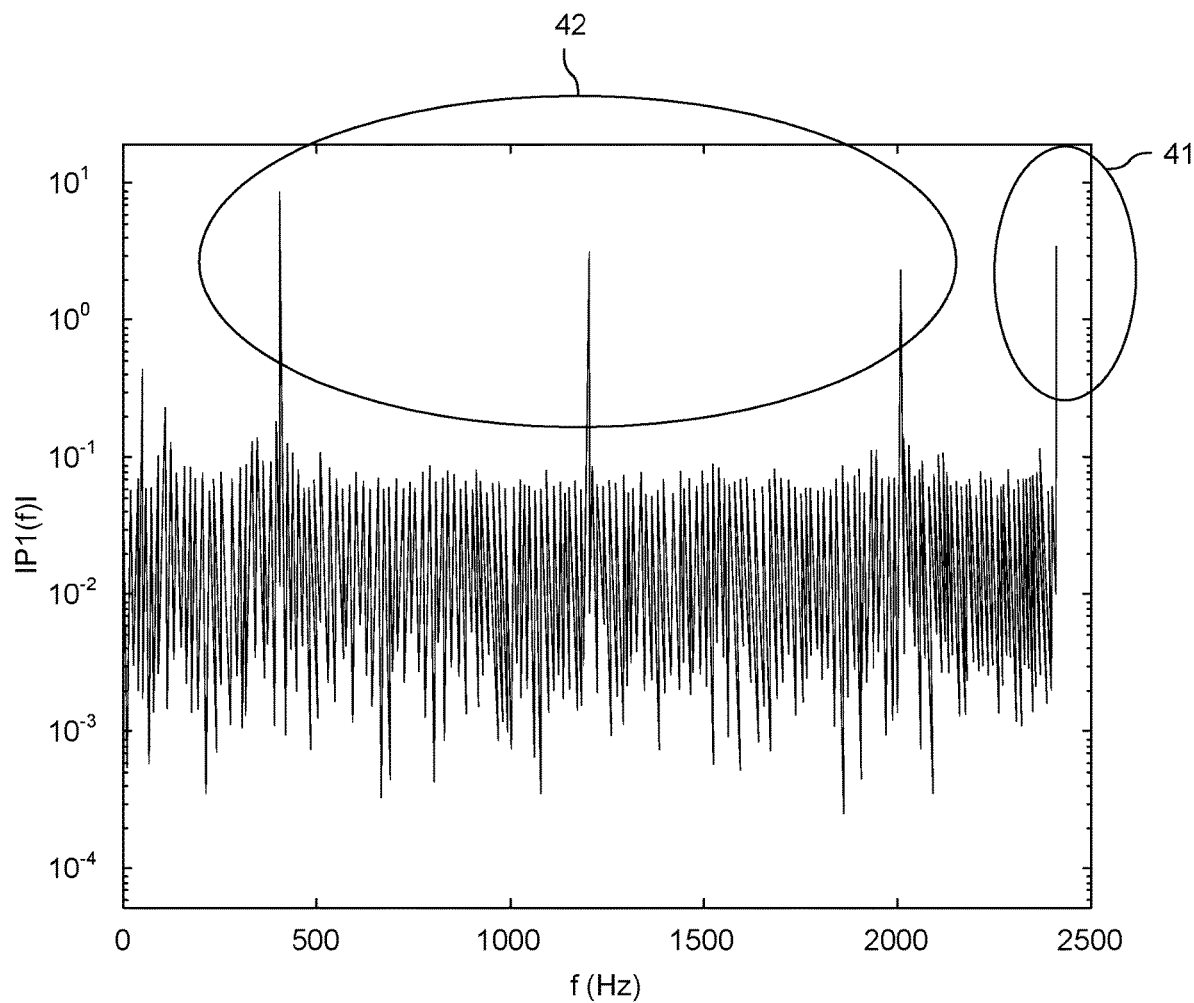
FIG. 4 shows an uncompensated PLL error spectrum according to one or more embodiments.

For example, the phase error signal p(n) may be represented, as shown in FIG. 4, as a PLL error spectrum (Fourier transform) of the compared zero-crossing timings (i.e., measured zero-crossing time vs. expected zero-crossing time).

The zero-crossing time deviations in the first rotation direction may differ from the zero-crossing time deviations in the second rotation direction. Thus, the phase error signal p(n) for a zero-crossing time in the first rotation direction may be different than the phase error signal p(n) for a zero-crossing time in the second rotation direction. This asymmetry in zero-crossing timings results in a periodic jitter component 41 in the PLL error spectrum. Due to this asymmetry in zero-crossing timings, at least a portion of the error budget needed to comply with accuracy requirements may be consumed. Therefore, it is desired to remove this error from the output of the phase error detector 32 so that the error is not introduced into the position information of the MEMS mirror 12.

In addition, chopping is a technique used to compensate for the analog offsets of operational amplifiers used in the analog core 31 of LIDAR system. The chopping signal generator 38 generates a chopping signal g(n) (e.g., +1 or −1). However, this chopping signal may also introduce periodic errors into the PLL error spectrum generated by the phase error detector. These periodic jitter components 42 shown in FIG. 4, also referred to as chopping errors, should also be removed from the output of the phase error detector 32 to improve the accuracy of the position information of the MEMS mirror 12.

Both the errors caused by the asymmetry of the mirror and by the chopping are introduced into the PLL error spectrum on a periodic basis as periodic jitter. In FIG. 4, these jitter components 41 and 42 are shown as abnormal peaks in the PLL error spectrum of the phase error signal p(n).

The error detection and compensation unit 33 is configured to receive the phase error signal p(n) from the phase error detector 32, detect the periodic jitter components 41 and 42, remove the periodic jitter components 41 and 42 from the phase error signal p(n) in order to generate a compensated phase error signal pcorr(n). The error detection and compensation unit 33 also receives the direction signal d(n) from the direction signal generator 37 and the chopping signal g(n) from the chopping signal generator 38.

Figure 5:
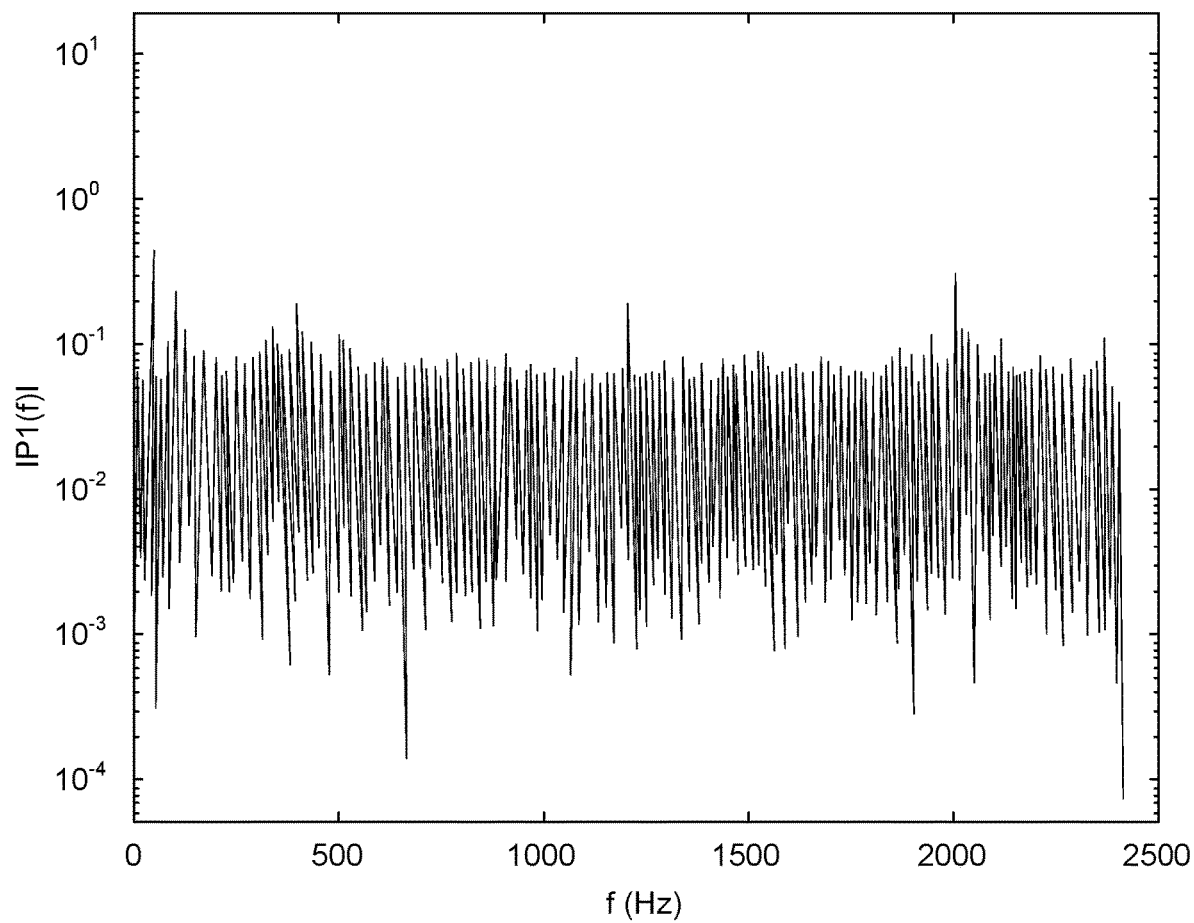
FIG. 5 shows a compensated PLL error spectrum according to one or more embodiments.

The compensated phase error signal pcorr(n) is shown in FIG. 5 as a compensated PLL error spectrum without the periodic jitter components 41 and 42. This effectively reduces the jitter of the PLL, which enables higher precision in sensing and controlling the MEMS mirror 12 as well as enables higher precision in controlling the illumination unit 10. Specifically, removing the periodic jitter components 41 and 42 from the phase error signal p(n) enables more accurate mirror position signaling (i.e., mirror position information), which enables more accurate laser shooting and more accurate controlling of the mirror. In addition, lifetime behavior predictions of the MEMS mirror 12 can be made based on analyzing the periodic jitter components 41 that are caused by the asymmetry of the MEMS mirror 12.

The error detection and compensation unit 33 includes a DSP structure made of circuitry logic (e.g., adders, subtractors, multipliers, integrators, dividers, and the like) coupled to form a signal processing chain that is configured to detect and compensate periodic jitter components. In particular, the DSP structure is configured to measure and compensate the two prominent error sources of mirror asymmetry and chopping induced periodic jitter.

Figure 6:
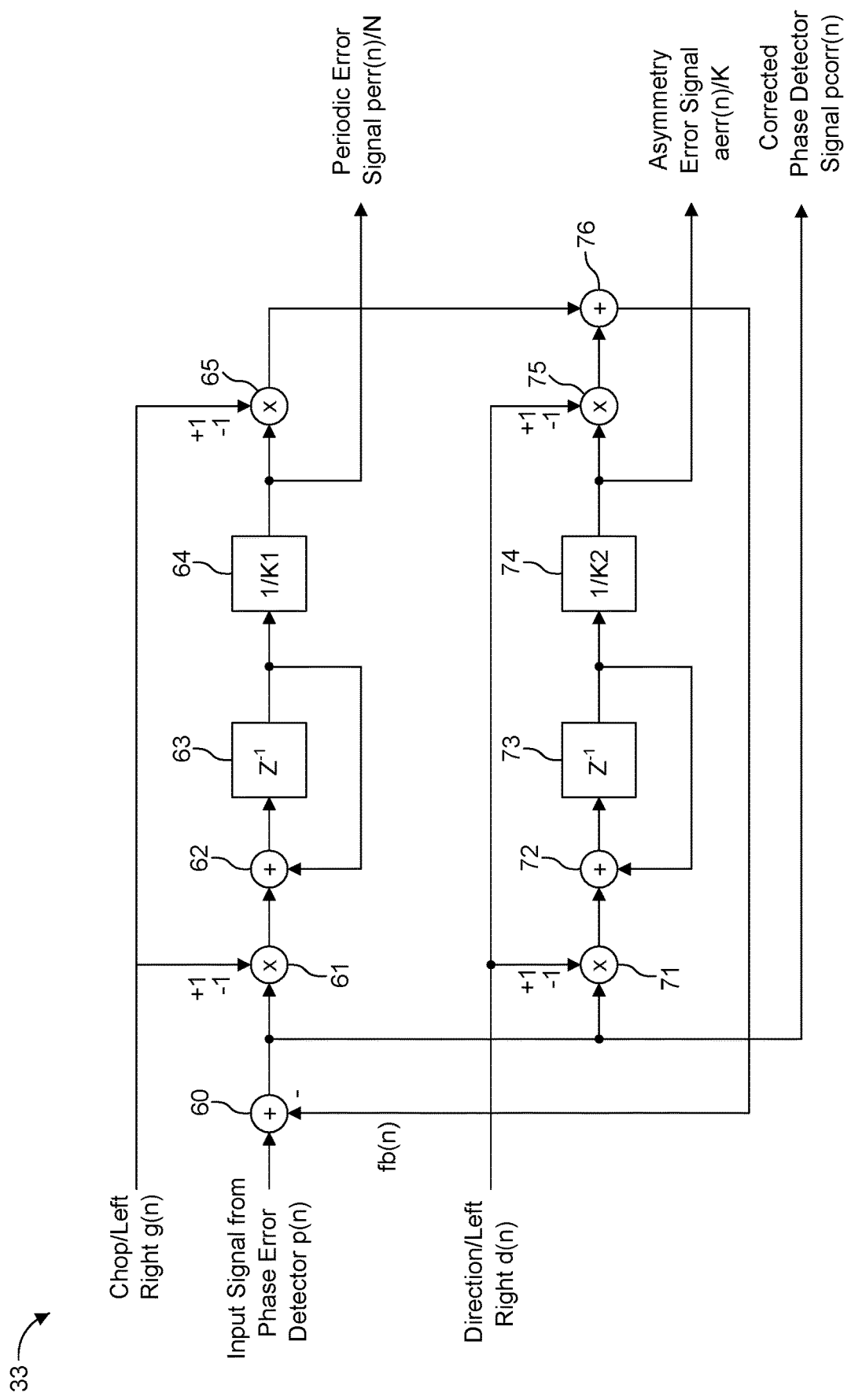
FIG. 6 shows a schematic block diagram of a periodic jitter compensation circuit according to one or more embodiments.

FIG. 6 shows a schematic block diagram of the periodic jitter compensation circuit of the error detection and compensation unit 33 according to one or more embodiments. The periodic jitter compensation circuit, as shown, is one possible DSP structure. However, it will be appreciated that the DSP structure is not limited to the depicted circuit, and that other circuit configurations are possible.

The concept of the DSP structure shown in FIG. 6 can be described by a system of difference equations (1).

$$\begin{cases} pcorr(n) = p(n) - \dfrac{aerr(n-1) \cdot d(n)}{K2} - \dfrac{perr(n-1) \cdot g(n)}{K1} \\ aerr(n) = aerr(n-1) + pcorr(n) \cdot d(n) \\ perr(n) = perr(n-1) + pcorr(n) \cdot g(n) \end{cases} \quad (1)$$

Here, K1 is a factor that correlates with the frequency of d(n) and K2 is factor that correlates with the frequency of g(n). In addition, (n) represents the current zero-crossing and (n−1) represents a previous zero-crossing (i.e., the last zero-crossing prior to the current zero-crossing).

The system has three input signals: the phase error signal p(n), the chopping signal g(n), and the direction signal d(n). Signal g(n) is the chopping signal that is a periodic signal with a configurable period, and that is a multiple of the mirror oscillating period. The direction signal d(n) is a mirror direction signal that is a periodic signal with a period matching the mirror oscillating period. Direction signal d(n) represents information about the mirror moving direction (i.e., whether the mirror is moving from left-to-right or vice versa).

The system further includes three output signals: a periodic error signal perr(n), an asymmetry error signal aerr(n), and the compensated phase error signal pcorr(n). The periodic error signal perr(n) includes the extracted periodic jitter components 42 caused by the chopping technique, whereas the asymmetry error signal aerr(n) includes the extracted periodic jitter components 41 caused by the mirror asymmetry.

In other words, detection and compensation of the periodic jitter components of the phase error signal p(n) is done by means of integrating the phase error signal p(n) that is previously multiplied with +1/−1 depending on the left/right direction information d(n) or chopping information g(n). The integrated signal is divided by a factor N/K, multiplied again with the left/right or chopping information, and finally added to the phase error signal p(n). Here, N is an integer and K is either K1 or K2. As a result, the corrected error signal pcorr(n) as well as the value of the periodic jitter components (i.e., the periodic error signal perr(n) and the asymmetry error signal aerr(n)) of the error signal can be obtained.

As shown in FIG. 6, the phase error signal p(n) is input into an adder (or subtractor) 60 which subtracts a feedback error signal fb(n) therefrom. The resulting signal is a corrected phase detector signal pcorr(n) that is then fed through two different signal paths. A first (top) signal path generates a periodic error signal perr(n)/N representative of the periodic jitter components 42 introduced by the chopper. The second (bottom) signal path generates an asymmetry error signal aerr(n)/K representative of the error introduced due to the asymmetry (i.e., the difference) between the zero-crossing times of the first and the second directions. The asymmetry error signal aerr(n)/K, as noted above, is also periodic.

The first (top) signal path also takes into account the chopping signal g(n), represented by +1 or −1, that is used to compensate operational amplifiers in analog circuitry of the LIDAR system. Thus, a chopping signal g(n) is received by the error detection and compensation unit 33, and utilized as shown in the first signal path. Thus, the periodic error signal perr(n)/N changes (e.g., multiplied by +/−1) according to the chopping signal g(n) via the multiplier 61. The signal is added by adder 62 to its integrated value generated by integrator 63, followed by a division by a divider 64, which divides by a value of K1. The output of the divider 64 is the periodic error signal perr(n)/N, which may be used by the system controller 23 to control the timing of the laser and activation of APD pixels. A multiplier 65 reverses any inversion of the signal previously caused by multiplier 61.

In summary, the phase error signal p(n) is combined with the chopper signal g(n), summed with its integrated signal, and divided by a factor K1.

The second (bottom) signal path takes into account the rotation direction of the mirror (e.g., rotating left or right) represented by +1 or −1. Thus, a direction signal d(n) is received by the error detection and compensation unit 33, and utilized as shown in the second signal path. Thus, the asymmetry error signal aerr(n)/K changes (e.g., multiplied by +/−1) according to the direction signal d(n) via the multiplier 71. The signal is added by adder 72 to its integrated value generated by integrator 73, followed by a division by a divider 74, which divides by a value of K2. The output of the divider 74 is the asymmetry error signal aerr(n)/K, which may be used by the system controller 23 to control the timing of the laser, the activation timing of APD pixels, and/or to detect aging of the MEMS mirror 12. A multiplier 75 reverses any inversion of the signal previously caused by multiplier 71.

In summary, the phase error signal p(n) is combined with the direction signal d(n), summed with its integrated signal, and divided by a factor K2.

An adder 76 receives the outputs of the first signal path and the second signal path, and generates the feedback error signal fb(n). In particular, the error detection and compensation unit 33 generates the feedback error signal fb(n) derived from a summation of the periodic error signal perr(n)/N and the asymmetry error signal aerr(n)/K, and then subtract the feedback error signal fb(n) from the phase error signal p(n) to generate a corrected phase detector signal pcorr(n). The subtraction of the feedback error signal fb(n) from the phase error signal p(n) removes the periodic jitter error components 41 and 42 from the phase error signal p(n) so that these errors no longer are included the position information of the MEMS mirror 12. Thus, the errors are no longer present to impact the control of the MEMS mirror and the timing of the laser pulses, leading to more accurate control of both components.

In particular, the corrected phase detector signal pcorr(n) is used to derive the signal $f_{DCO}$ of the DCO 35 and forms a basis for the mirror position information generated by the mirror driver 36. In particular, the error detection and compensation unit 33 outputs the corrected phase detector signal pcorr(n) to the loop filter 34, which implements either proportional-integral (PI) or proportional-integral-derivative (PID) control to increment the DCO 35 to adjust the phase of the DCO 35. Because the periodic jitter components 41 and 42 are absent from the corrected phase detector signal pcorr(n), the phase of signal $f_{DCO}$ of the DCO 35 is not influenced from these jitter components and more accurately corresponds to the phase of the MEMS mirror 12. The DCO 35 provides the signal $f_{DCO}$ to the mirror driver 36.

The mirror driver 36 is a mirror scheduler that determines a subtiming of the MEMS mirror 12 based on the signal $f_{DCO}$. Thus, the mirror driver 36 includes at least one processor for performing timing analysis and scheduling. Based on the subtiming, the mirror driver 36 is configured to generate a driving voltage HV as a control signal to control the oscillation of the MEMS mirror 12. More specifically, the driving voltage HV (e.g., 100V) is toggled on and off, and is applied to the actuator structure of the MEMS mirror 12 as previously described above. The mirror driver 36 is not only configured to switch the driving voltage HV on and off, but may also drive the voltage to any level (e.g., full on, half-full off, etc.).

The mirror driver 36 determines mirror position information based on the signal $f_{DCO}$, and outputs the mirror position information to the system controller 23. The mirror position information actively indicates a position of the MEMS mirror 12. The system controller 23 may use the mirror position information to control the timing of the laser pulses of the illumination unit 10. The mirror position information may also be used to control the activation timing of the diodes of the photodetector array 15.

The mirror driver 36 may also determine the expected zero-crossing times ZCref based on the mirror position information.

As shown in FIG. 3, system controller 23 also receives two of the output signals (i.e., the a periodic error signal perr(n) and the asymmetry error signal aerr(n)) from the error detection and compensation unit 33. The system controller 23 may use one or both of the output signals to control laser pulse timing and photodiode activation timing. The system controller 23 may also be used to configure the mirror driver 36 with certain parameters (e.g., during startup).

In addition, the system controller 23 may use the asymmetry error signal aerr(n) to predict a failure or breaking of the MEMS mirror 12. The asymmetry error signal aerr(n) represents the asymmetry (i.e., the difference) between the zero-crossing times of the first and the second rotation directions. As noted above, the asymmetry of the MEMS mirror may become worse over time due to aging until the asymmetry reaches a critical point and breaks. Thus, the value of the asymmetry error signal aerr(n) may change over time due to this aging effect, as shown in FIG. 7.

Figure 7:
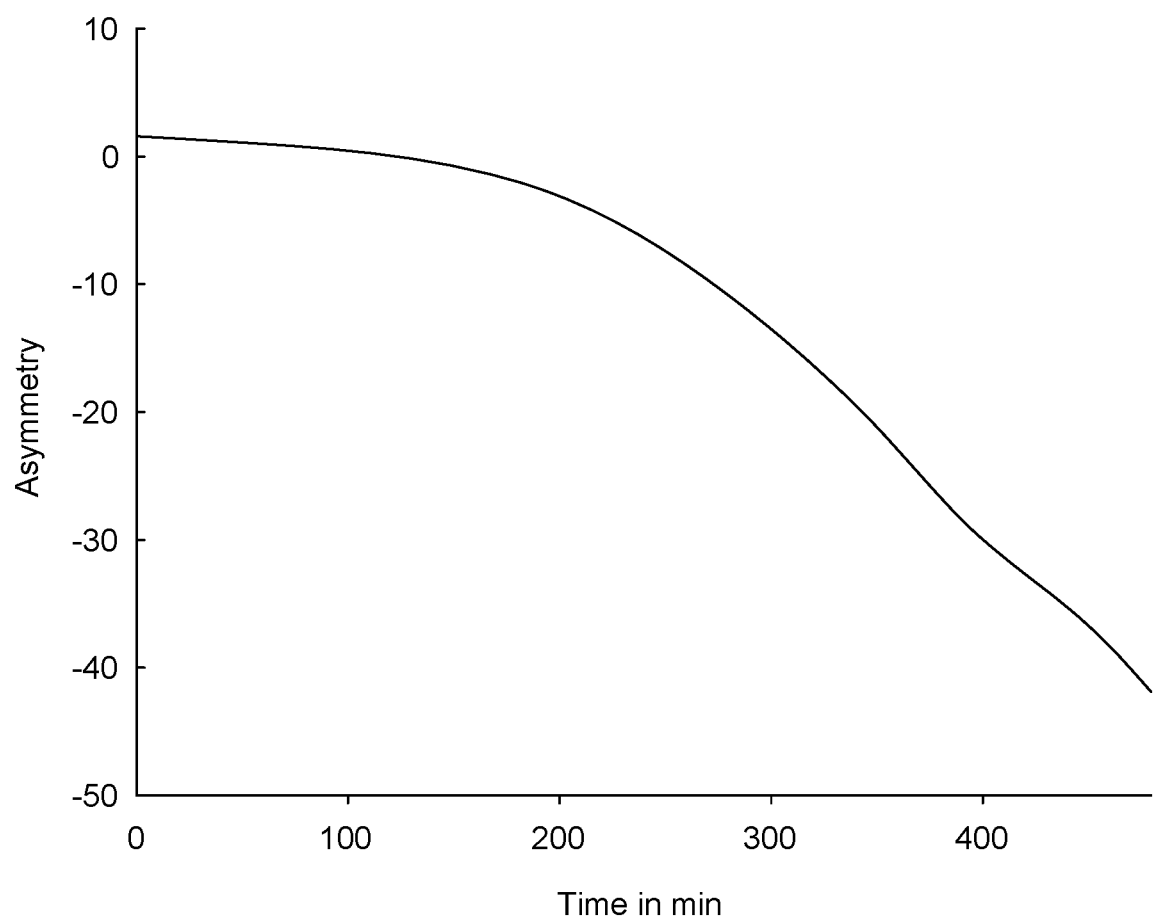
FIG. 7 shows a graph of an asymmetry error signal over time according to one or more embodiments.

In particular, FIG. 7 shows a graph of a changing asymmetry of the MEMS mirror 12 over time (mins). As the MEMS mirror 12 ages, the asymmetry increases. A breaking point of the MEMS mirror or its spring leaves may be known to occur at or around a certain asymmetry value. Thus, lifetime behavior predictions of the mirror, including a breaking point or a critical phase of the MEMS mirror, can be made based on the asymmetry error signal aerr(n).

For example, the system controller 23 may be configured to monitor the value of the asymmetry error signal aerr(n) to ensure the MEMS mirror is in a specified operating state. If the asymmetry error signal aerr(n) crosses a critical threshold, set before the breaking point of the mirror, the system controller 23 may issue a warning indicating that the MEMS mirror has entered a critical phase in which the MEMS mirror may break in the near future. This warning may indicate to a user that the MEMS mirror is in need of repair or replacement as preventive maintenance.

In particular, the system controller may compare the value of the asymmetry error signal aerr(n) with one or more thresholds (e.g., +/− critical value) which is set at a point near, but prior to, failure of the mirror. For example, a negative critical value may be set for the condition that the zero-crossing time is faster in the first rotation direction, and a positive critical value may be set for the condition that the zero-crossing time is faster in the second rotation direction. In this example, the critical thresholds may be set at +/−30. Between the two thresholds, it can be said that the MEMS mirror is operating within the specified state of normal operation.

However, outside the thresholds, it can be said that the MEMS mirror is no longer operating in the specified state. Thus, the MEMS mirror may no longer be able to comply with safety requirements or may be about to break. In this way, the system controller may be configured to determine that the asymmetry error signal aerr(n) meets or exceeds one of the thresholds and alert a user of the LIDAR system, by an indicator or an alarm, that the MEMS mirror is in need of repair or replacement.

In view of the above, improvements to current LIDAR systems may include one or more of the following.

The timing differences of the mirror's zero-crossing events from the left side and the right side (e.g., +/−50 ns which equals +/−10 m° angle error at 2200 Hz resonance frequency and 15° amplitude) can be properly compensated.

The corrected error signal can be used to control the mirror. As the periodic jitter errors are cancelled, a better functionality of the control loop can be achieved.

A system ASIC may use the asymmetry signal in order to determine perfectly matching (compensated) shooting time of the laser pulses.

As the corrected error signal is used to monitor possible position errors of the mirror, tighter limits can be used as the periodic portions of the error signal account for a significant portion of the overall error signal. This allows the detection of position errors of the mirror with higher precision. Furthermore, the periodic jitter components of the error signal can be used for monitoring, e.g., offset drift of circuits and ageing of the mirror.

Knowing the development of the asymmetry of a mirror may enable crucial analyses (such as aging) without a need to know of the actual resonance frequency of the mirror.

The DSP implementation of the concept is area and power efficient. It requires a 4-bit counter for producing the chopping signal, two 16-bit memory elements to store the asymmetry error signal and the periodic error signal, four full 16-bit adders/subtractors, and four 16-bit multiplexers. As the periodic jitter compensation circuit operates only at the zero-crossing, an efficient clock gating of memory elements is possible. The rest of the logic is of a combinatorial nature and will be changing its state only if any of the input signals will change (once per mirror zero-crossing) and, therefore, is not consuming power for the rest of the half mirror period.

In addition, the above embodiments may be implemented independent of temperature.

Although embodiments described herein relate to a MEMS device with a mirror, it is to be understood that other implementations may include optical devices other than MEMS mirror devices or other MEMS oscillating structures. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structures or any other structure suitable for implementation of the techniques described herein. In addition, in some aspects, the functionality described herein may be provided within dedicated hardware and/or software modules. Also, the techniques could be fully implemented in one or more circuits or logic elements.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A system, comprising:
a microelectromechanical systems (MEMS) oscillating structure configured to oscillate about a rotation axis;
analog circuitry configured to measure a rotation angle of the MEMS oscillating structure about the rotation axis, and detect event times of the MEMS oscillating structure based on the measured rotation angle, wherein an event time is detected at each time instance the measured rotation angle crosses a target rotation angle of one or more target rotation angles;
a phase error detector circuit configured to receive the detected event times from the analog circuitry, receive expected event times of the MEMS oscillating structure oscillating about the rotation axis, determine a timing difference between the detected event times and the expected event times, and generate a phase error signal representative of the determined timing difference between the detected event times and the expected event times; and
a compensation circuit configured to receive the phase error signal, remove periodic jitter components in the phase error signal to generate a compensated phase error signal, and output the compensated phase error signal.

2. The system of claim 1, wherein the compensation circuit is configured to detect first periodic jitter components in the phase error signal resulting from a mechanical asymmetry of the MEMS oscillating structure, extract the detected first periodic jitter components from the phase error signal, and generate an asymmetry error signal based on the extracted first periodic jitter components.

3. The system of claim 2, further comprising:
an asymmetry monitoring circuit configured to receive the asymmetry error signal from the compensation circuit, compare a value of the asymmetry error signal to a threshold value, and generate an failure prediction signal on a condition that the value of the asymmetry error signal exceeds the threshold value, wherein the failure prediction signal indicates a failure prediction of the MEMS oscillating structure.

4. The system of claim 2, further comprising:
an illumination arrangement configured to transmit pulsed light at the MEMS oscillating structure; and
a controller configured to receive the asymmetry error signal from the compensation circuit, and control a triggering of the pulsed light based on the asymmetry error signal.

5. The system of claim 2, wherein the compensation circuit is configured to detect second periodic jitter components in the phase error signal resulting from input offset voltage compensation performed via chopping, extract the detected second periodic jitter components from the phase error signal, and generate a chopping error signal based on the extracted second periodic jitter components.

6. The system of claim 5, where the compensation circuit is configured to generate the compensated phase error signal based on the phase error signal corresponding to a current detected event time, the asymmetry error signal corresponding to a previous detected event time, and the chopping error signal corresponding to the previous detected event time.

7. The system of claim 1, wherein the periodic jitter components include periodic asymmetry errors, and the compensation circuit is configured to remove the periodic asymmetry errors from the phase error signal to generate the compensated phase error signal.

8. A system, comprising:
a microelectromechanical systems (MEMS) oscillating structure configured to oscillate about a rotation axis;
a phase error detector configured to generate a phase error signal based on measured event times and expected event times of the MEMS oscillating structure oscillating about the rotation axis; and
a compensation circuit configured to receive the phase error signal, remove periodic jitter components in the phase error signal to generate a compensated phase error signal, and output the compensated phase error signal,
wherein the periodic jitter components include periodic chopping errors, and the compensation circuit is configured to remove the periodic chopping errors from the phase error signal to generate the compensated phase error signal.

9. The system of claim 8, wherein the compensation circuit is configured to detect the periodic chopping errors in the phase error signal, extract the detected periodic chopping errors from the phase error signal, and generate a periodic error signal based on the extracted periodic chopping errors.

10. The system of claim 1, wherein:
the detected event times are detected zero crossing times at which a rotation angle of the MEMS oscillating structure is 0° as the MEMS oscillating structure oscillates about the rotation axis, and
the expected event times are expected zero crossing times at which the rotation angle of the MEMS oscillating structure is expected to be 0°.

11. The system of claim 1, wherein the phase error detector circuit is configured to determine timing differences between the detected zero crossing times and the expected zero crossing times, where the phase error detector circuit determines a timing difference for each of the detected zero crossing times and a respective one of the expected zero crossing times, and generates the phase error signal representative of the determined timing differences.

12. The system of claim 1, further comprising:
a phase-locked loop (PLL) loop filter,
wherein the MEMS oscillating structure, the phase error detector circuit, and the compensation circuit are arranged in a control loop of the PLL, and the PLL loop filter is configured to receive the compensated phase error signal from the compensation circuit.

13. The system of claim 1, further comprising:
an illumination arrangement configured to transmit pulsed light;
a photodetector array configured to detect received light and generate electrical signals based on the received light;
a driver configured to drive the MEMS oscillating structure about the rotation axis; and
a controller configure to receive the compensated phase error signal and control at least one of the laser illumination arrangement, the photodetector array, and the driver based on the compensated phase error signal.

14. The system of claim 1, further comprising:
an illumination arrangement configured to transmit light at the MEMS oscillating structure; and
a controller configured to receive the compensated phase error signal, and control a triggering of the light based on the compensated phase error signal.

15. A method of compensating errors, comprising:
driving a microelectromechanical systems (MEMS) oscillating structure configured to oscillate about a rotation axis;
measuring a rotation angle of the MEMS oscillating structure about the rotation axis;
detecting event times of the MEMS oscillating structure based on the measured rotation angle, wherein an event time is detected at each time instance the measured rotation angle crosses a target rotation angle of one or more target rotation angles;
determining a timing difference between the detected event times and expected event times of the MEMS oscillating structure oscillating about the rotation axis;
generating a phase error signal representative of the determined timing difference between the detected event times and the expected event times, wherein the phase error signal includes periodic jitter components;
generating a compensated phase error signal by removing the periodic jitter components from the phase error signal; and
outputting the compensated phase error signal.

16. The method of claim 15, further comprising:
generating an asymmetry error signal by detecting first periodic jitter components in the phase error signal resulting from a mechanical asymmetry of the MEMS oscillating structure, extracting the detected first periodic jitter components from the phase error signal, and generating the asymmetry error signal based on the extracted first periodic jitter components.

17. The method of claim 16, further comprising:
comparing a value of the asymmetry error signal to a threshold value; and
generating a failure prediction signal on a condition that the value of the asymmetry error signal exceeds the threshold value, wherein the failure prediction signal indicates a failure prediction of the MEMS oscillating structure.

18. The method of claim 15, further comprising:
generating light pulses based on the compensated phase error signal.

19. A Light Detection and Ranging (LIDAR) system, comprising:
a LIDAR light source configured to generate LIDAR light beams;
a microelectromechanical systems (MEMS) oscillating structure configured to oscillate about a rotation axis and transmit the LIDAR light beams into a field of view;
a photodetector array configured to detect reflected LIDAR light beams from the field of view and generate electrical signals based on the reflected LIDAR light beams;
analog circuitry configured to measure a rotation angle of the MEMS oscillating structure about the rotation axis, and detect event times of the MEMS oscillating structure based on the measured rotation angle, wherein an event time is detected at each time instance the measured rotation angle crosses a target rotation angle of one or more target rotation angles;
an error detector circuit configured to receive the detected event times from the analog circuitry, receive expected event times of the MEMS oscillating structure oscillating about the rotation axis, determine a timing difference between the detected event times and the expected event times, and generate an error signal representative of the determined timing difference between the detected event times and the expected event times;
a compensation circuit configured to receive the error signal and generate a compensated error signal to actively compensate for a timing error based on the error signal.

20. The system of claim 1, further comprising:
a driver configured to drive the MEMS oscillating structure about the rotation axis, generate the expected event times, and transmit the expected event times to the phase error detector circuit.

21. The system of claim 2, further comprising:
a direction signal generator configured generate a direction signal representative of a rotation direction of the MEMS oscillating structure during oscillation about the rotation axis,
wherein the compensation circuit multiplies the direction signal with the phase error signal to generate a multiplied signal and integrates the multiplied signal to generate the asymmetry error signal.

* * * * *